United States Patent
Sugita et al.

(10) Patent No.: US 10,837,991 B2
(45) Date of Patent: Nov. 17, 2020

(54) ELECTROSTATIC CAPACITANCE MEASURING DEVICE

(71) Applicant: TOKYO ELECTRON LIMITED, Tokyo (JP)

(72) Inventors: Kippei Sugita, Miyagi (JP); Tomohide Minami, Miyagi (JP); Satoru Nishio, Hyogo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 36 days.

(21) Appl. No.: 15/938,662

(22) Filed: Mar. 28, 2018

(65) Prior Publication Data

US 2018/0284171 A1 Oct. 4, 2018

(30) Foreign Application Priority Data

Mar. 29, 2017 (JP) .................. 2017-064814

(51) Int. Cl.
*G01R 27/26* (2006.01)
*H01L 21/67* (2006.01)
(Continued)

(52) U.S. Cl.
CPC ..... *G01R 27/2605* (2013.01); *G01R 31/2831* (2013.01); *H01L 21/67259* (2013.01);
(Continued)

(58) Field of Classification Search
CPC ........ G01R 31/282–2831; G01R 27/26; G01R 27/2605; G01R 31/2831; G01R 31/2849;
(Continued)

(56) References Cited

U.S. PATENT DOCUMENTS

2009/0051370 A1  2/2009 Doki et al.
2009/0086879 A1* 4/2009 Ogata .................. G01D 5/2417
377/17
(Continued)

FOREIGN PATENT DOCUMENTS

CN   103460058 A   12/2013
JP   4956328 B2    6/2012

*Primary Examiner* — Vinh P Nguyen
(74) *Attorney, Agent, or Firm* — Rothwell, Figg, Ernst & Manbeck, P.C.

(57) ABSTRACT

An electrostatic capacitance measuring device includes: a base substrate; a first sensor having a first electrode, one or more second sensors each having a second electrode, and a circuit board mounted on the base substrate. The first sensor is provided along an edge of the base substrate. The second sensors are fixed on the base substrate. The circuit board is connected to the first sensor and the second sensors, and configured to output high frequency signals to the first electrode and the one or more second electrodes and obtain a first measurement value indicating an electrostatic capacitance from a voltage amplitude at the first electrode and one or more second measurement values indicating electrostatic capacitances obtained from voltage amplitudes at the one or more second electrodes. The measuring device has one or more reference surfaces fixed on the measuring device and facing the one or more second electrodes.

14 Claims, 13 Drawing Sheets

(51) Int. Cl.
  *H01L 21/683* (2006.01)
  *G01R 31/28* (2006.01)
  *H01J 37/32* (2006.01)
  *H01L 21/677* (2006.01)
  *H05K 1/02* (2006.01)

(52) U.S. Cl.
  CPC ...... *H01L 21/6831* (2013.01); *H01L 21/6833* (2013.01); *G01R 31/2849* (2013.01); *G01R 31/2865* (2013.01); *G01R 31/2875* (2013.01); *G01R 31/2881* (2013.01); *H01J 37/32091* (2013.01); *H01J 2237/334* (2013.01); *H01L 21/67069* (2013.01); *H01L 21/67167* (2013.01); *H01L 21/67742* (2013.01); *H05K 1/0237* (2013.01); *H05K 2201/10151* (2013.01)

(58) Field of Classification Search
  CPC ............ G01R 31/2865; G01R 31/2875; G01R 31/2881; H01L 21/67259; H01L 21/683–6833; H01L 21/67069; H01L 21/67167; H01L 21/67742; H01L 21/6831; H01L 21/6833; H05K 1/0237; H05K 2201/10151
  See application file for complete search history.

(56) References Cited

U.S. PATENT DOCUMENTS

| | | | |
|---|---|---|---|
| 2012/0017703 A1* | 1/2012 | Ikebe | B25J 13/083 |
| | | | 73/862.626 |
| 2013/0083399 A1* | 4/2013 | Hirokubo | G01J 3/26 |
| | | | 359/578 |
| 2013/0207677 A1* | 8/2013 | Togura | G01R 27/2605 |
| | | | 324/685 |
| 2013/0233077 A1* | 9/2013 | Chen | G01P 15/125 |
| | | | 73/514.18 |
| 2014/0111189 A1* | 4/2014 | Makuth | G01R 29/12 |
| | | | 324/123 R |
| 2015/0318799 A1* | 11/2015 | Hirokubo | G05B 11/14 |
| | | | 359/584 |
| 2016/0087629 A1* | 3/2016 | Nishiyama | G01R 27/26 |
| | | | 200/17 R |
| 2016/0363433 A1* | 12/2016 | Sugita | G01D 5/2417 |
| 2017/0322647 A1* | 11/2017 | Katsuhara | H03K 17/96 |

* cited by examiner

ELECTROSTATIC CAPACITANCE MEASURING DEVICE

CROSS-REFERENCE TO RELATED APPLICATIONS

This application claims priority to Japanese Patent Application No. 2017-064814 filed on Mar. 29, 2017, the entire contents of which are incorporated herein by reference.

FIELD OF THE INVENTION

The present disclosure relates to an electrostatic capacitance measuring device.

BACKGROUND OF THE INVENTION

In manufacturing electronic devices such as semiconductor devices, a processing system for processing a disc-shaped target object is used. The processing system includes a transfer mechanism for transferring the target object and a processing device for processing the target object. The processing device generally has a chamber main body and a stage provided in the chamber main body. The stage is configured to support a target object mounted thereon. The transfer mechanism is configured to transfer the target object onto the stage.

When the target object is processed by the processing device, a position of the target object on the stage is significant. Therefore, when the position of the target object on the stage is deviated from a predetermined position, it is necessary to adjust the transfer mechanism.

In a conventional technique for adjusting the transfer mechanism, which is disclosed in Japanese Patent No. 4956328, a recess is formed on a stage. Further, in the technique disclosed in Japanese Patent No. 4956328, a measuring device formed in the same disc shape as that of a target object and having an electrode for capacitance measurement is used. In the conventional technique, the measuring device is transferred onto the stage by a transfer mechanism; a measurement value of an electrostatic capacitance, depending on the relative positional relation between the recess and the electrode, is acquired; and the transfer mechanism is adjusted to correct a transfer position of the target object based on the measurement value.

However, in the measuring device for measuring an electrostatic capacitance as in the above conventional technique, even if a distance between the electrode for measuring an electrostatic capacitance and the target object facing the electrode is constant, the measured electrostatic capacitance may vary depending on changes in a surrounding environment such as temperature, humidity and the like. Accordingly, a measuring device configured to correct the variation in the measured electrostatic capacitance depending on the environment is required.

SUMMARY OF THE INVENTION

In accordance with an aspect, there is provided an electrostatic capacitance measuring device. The electrostatic capacitance measuring device includes a base substrate, a first sensor, one or more second sensors and a circuit board. The first sensor has a first electrode and is provided along an edge of the base substrate. The one or more second sensors are fixed on the base substrate and each has a second electrode. The circuit board is mounted on the base substrate and connected to the first sensor and said one or more second sensors. The circuit board is configured to output high frequency signals to the first electrode and the one or more second electrodes and obtain a first measurement value indicating an electrostatic capacitance from a voltage amplitude at the first electrode and one or more second measurement values indicating electrostatic capacitances obtained from voltage amplitudes at the one or more second electrodes. The measuring device has one or more reference surfaces that are fixed on the measuring device and respectively face the one or more second electrodes.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
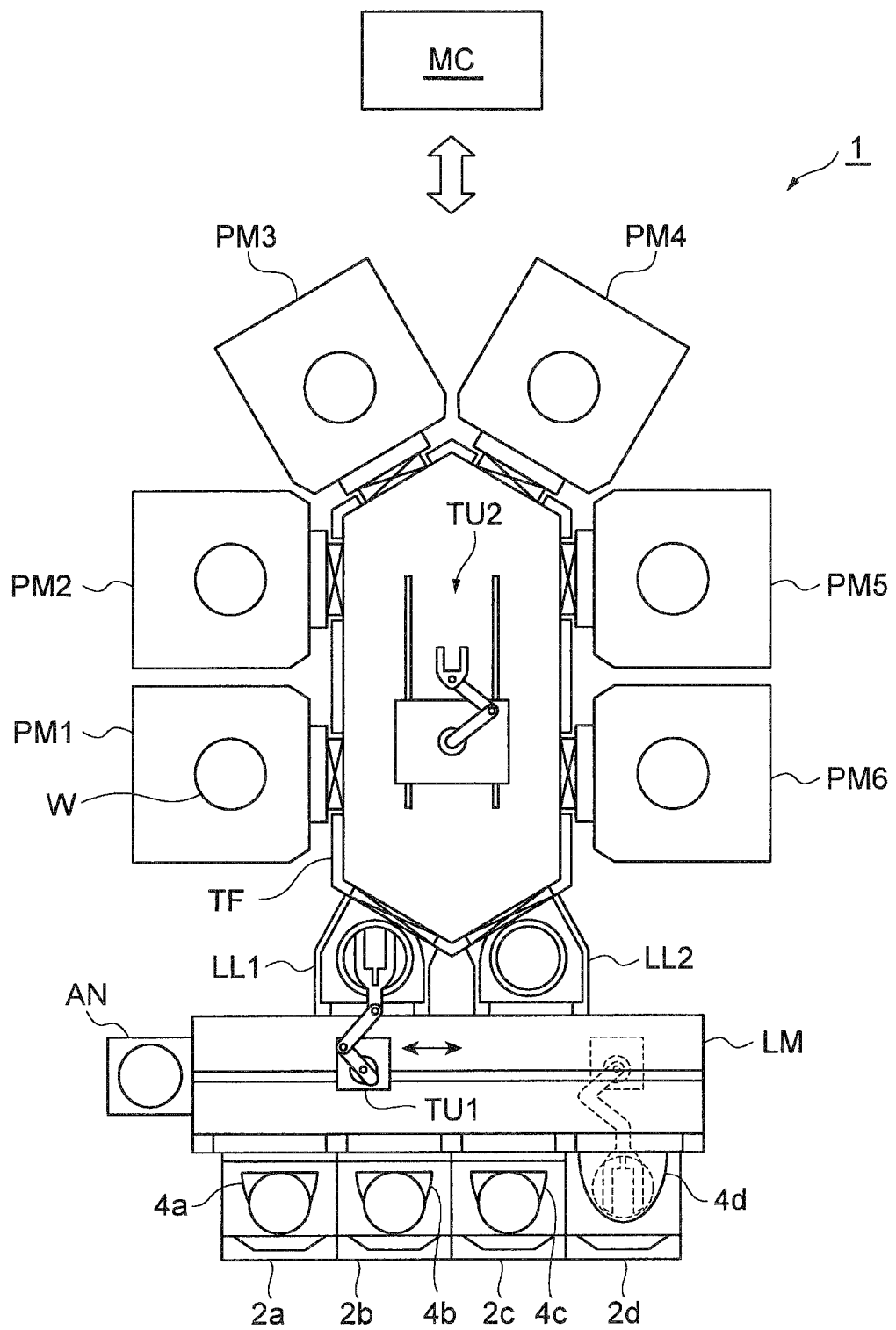
FIG. 1 shows a processing system.

Hereinafter, embodiments will be described in detail with reference to the accompanying drawings. Like reference numerals will be given to like or corresponding parts throughout the drawings.

First, a processing system including a processing device for processing a target object and a transfer mechanism for transferring the target object to the processing device will be described. FIG. 1 shows the processing system. A processing system 1 includes tables 2a to 2d, containers 4a to 4d, a loader module LM, an aligner AN, load-lock modules LL1 and LL2, process modules PM1 to PM6, a transfer module TF, and a control unit MC. The number of the tables 2a to 2d, the number of the containers 4a to 4d, the number of the load-lock modules LL1 and LL2, and the number of the process modules PM1 to PM6 are not limited and may be any number greater than or equal to 1.

The tables 2a to 2d are arranged along one side of the loader module LM. The containers 4a to 4d are mounted on the tables 2a to 2d, respectively. Each of the containers 4a to 4d is, e.g., a container referred to as "FOUP (Front Opening Unified Pod)". Each of the containers 4a to 4d is configured to accommodate target objects W. The target object W is formed in, e.g., a substantially disc shape.

The loader module LM has a chamber wall that defines a transfer space in an atmospheric pressure state. In the transfer space, a transfer mechanism TU1 is provided. The transfer mechanism TU1 is, e.g., a multi-joint robot, and is controlled by a control unit MC. The transfer mechanism TU1 is configured to transfer the target object W between the containers 4a to 4d and the aligner AN, between the aligner AN and the load-lock modules LL1 and LL2, and between the load-lock modules LL1 and LL2 and the containers 4a to 4d.

Figure 2:
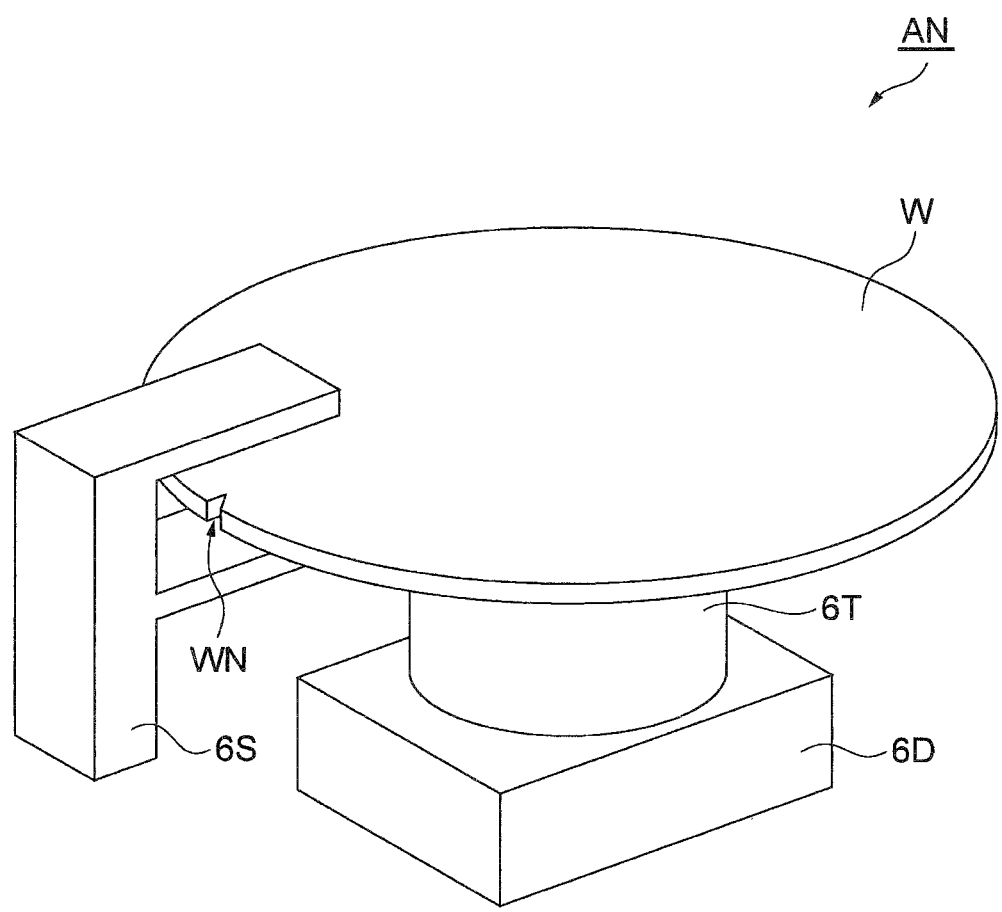
FIG. 2 is a perspective view of an aligner.

The aligner AN is connected to the loader module LM. The aligner AN is configured to adjust (correct) a position of the target object W. FIG. 2 is a perspective view showing an example of the aligner. The aligner AN has a supporting table 6T, a driving unit 6D, and a sensor 6S. The supporting table 6T is a table capable of rotating about an axis line extending in a vertical direction and configured to support thereon the target object W. The supporting table 6T is rotated by the driving unit 6D. The driving unit 6D is controlled by the control unit MC. When the supporting table 6T is rotated by power from the driving unit 6D, the target object W mounted on the supporting table 6T is also rotated.

The sensor 6S is an optical sensor and detects an edge of the target object W during the rotation of the target object W. The sensor 6S detects deviation of an angular position of a notch WN (or another marker) of the target object W from a reference angular position and deviation of the central position of the target object W from a reference position based on the edge detection result. The sensor 6S outputs the deviation of the angular position of the notch WN and the deviation of the central position of the target object W to the control unit MC. The control unit MC calculates a rotation amount of the supporting table 6T which will be used for correcting the angular position of the notch WN to the reference angular position based on the deviation of the angular position of the notch WN. The control unit MC controls the driving unit 6D such that the supporting table 6T is rotated by the calculated rotation amount. Accordingly, the angular position of the notch WN can be corrected to the reference angular position. The control unit MC controls a position of an end effector of the transfer mechanism TU1 at the time of receiving the target object W from the aligner AN based on the deviation of the central position of the target object W such that the central position of the target object W coincides with a predetermined position on the end effector of the transfer mechanism TU1.

Referring back to FIG. 1, each of the load-lock modules LL1 and LL2 is provided between the loader module LM and the transfer module TF. Each of the load-lock modules LL1 and LL2 provides a preliminary decompression chamber.

The transfer module TF is connected to the load-lock modules LL1 and LL2 through gate valves, respectively. The transfer module TF provides a depressurizable decompression chamber. In the decompression chamber, a transfer mechanism TU2 is provided. The transfer mechanism TU2 is, e.g., a multi-joint robot, and is controlled by the control unit MC. The transfer mechanism TU2 is configured to transfer the target object W between the load-lock modules LL1 and LL2 and the process modules PM1 to PM6, and between two process modules among the process modules PM1 to PM6.

The process modules PM1 to PM6 are connected to the transfer module TF through gate valves. Each of the process modules PM1 to PM6 is a processing device configured to perform plasma processing on the target object W.

The following is a description of a series of operations at the time of processing the target object W in the processing system 1. The target object W is unloaded from any one of the containers 4a to 4d and transferred to the aligner AN by the transfer mechanism TU1 of the loader module LM. Next, the transfer mechanism TU1 transfers the aligned target object W from the aligner AN to one of the load-lock modules LL1 and LL2. Then, a pressure in the preliminary decompression chamber of the load-lock module LL1 or LL2 is decreased to a predetermined level. Thereafter, the target object W is transferred from the load-lock module LL1 or LL2 to one of the process modules PM1 to PM6 by the transfer mechanism TU2 of the transfer module TF. The target object W is processed in one or more process modules among the process modules PM1 to PM6. Next, the processed target object W is transferred from the process module to one of the load-lock modules LL1 and LL2 by the transfer mechanism TU2. Then, the target object W is transferred from the load-lock module LL1 or LL2 to one of the containers 4a to 4d by the transfer mechanism TU1.

As described above, the processing system 1 includes the control unit MC. The control unit MC may be a computer including a processor, a storage unit such as a memory, a display unit, an input/output unit, a communication device or the like. The above-described series of operations of the processing system 1 are realized by controlling the respective components of the processing system 1 by the control unit MC based on a program stored in the storage unit.

Figure 3:
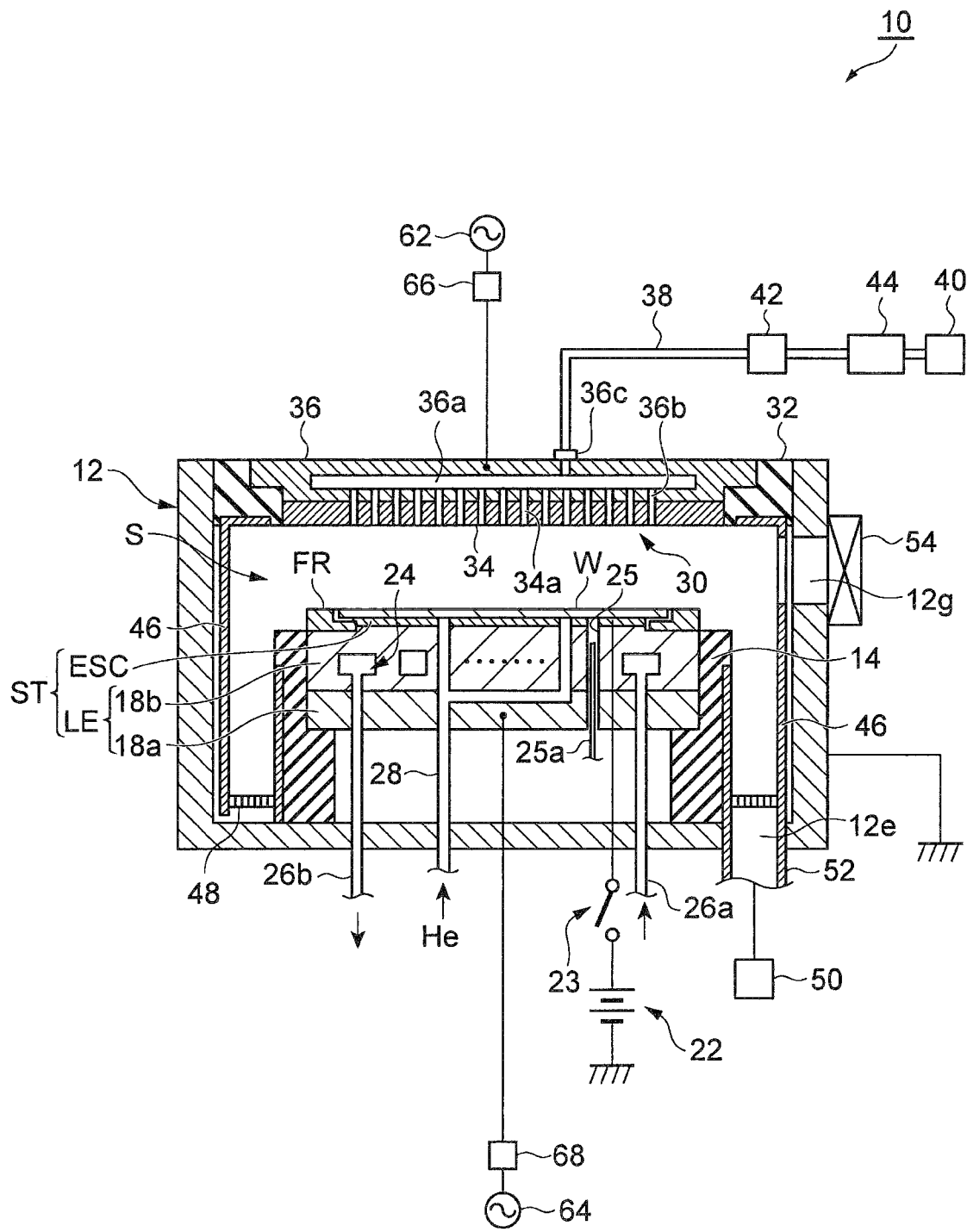
FIG. 3 shows an example of a plasma processing apparatus.

FIG. 3 shows an example of a plasma processing apparatus that may be employed as one of the process modules PM1 to PM6. A plasma processing apparatus 10 shown in FIG. 3 is a capacitively coupled plasma etching apparatus. The plasma processing apparatus 10 includes a chamber main body 12. The chamber main body 12 has a substantially cylindrical shape. The chamber main body 12 is made of, e.g., aluminum. Anodic oxidation treatment may be performed on an inner wall surface of the chamber main body 12. The chamber main body 12 is grounded.

A supporting member 14 is provided on a bottom portion of the chamber main body 12. The supporting member 14 has a substantially cylindrical shape. The supporting member 14 is made of, e.g., an insulating material. The supporting member 14 is provided in the chamber main body 12 and extends upward from the bottom portion of the chamber main body 12. In a chamber S defined by the chamber main body 12, a stage ST is provided. The stage ST is supported by the supporting member 14.

The stage ST includes a lower electrode LE and an electrostatic chuck ESC. The lower electrode LE has a first plate 18a and a second plate 18b. The first plate 18a and the second plate 18b are made of a metal, e.g., aluminum, and has a substantially disc shape. The second plate 18b is provided on the first plate 18a. The second plate 18b is electrically connected to the first plate 18a.

The electrostatic chuck ESC is provided on the second plate 18b. The electrostatic chuck ESC has a structure in which an electrode that is a conductive film is embedded between two insulating layers or sheets, and has a substantially disc shape. A DC power supply 22 is electrically connected to the electrode of the electrostatic chuck ESC through a switch 23. The target object W is attracted and held on the electrostatic chuck ESC by an electrostatic force such as Coulomb force or the like that is generated by a DC voltage from the DC power supply 22. Accordingly, the target object W can be held on the electrostatic chuck ESC.

A focus ring FR is provided on a peripheral portion of the second plate 18b. The focus ring FR surrounds an edge of the target object W and the electrostatic chuck ESC. The focus ring FR has a first portion P1 and a second portion P2 (see FIG. 6). The first portion P1 and the second portion P2 have an annular plate shape. The second portion P2 is disposed on the first portion P1. A diameter of an inner periphery P2i of the second portion P2 is greater than a diameter of an inner periphery P1i of the first portion P1. The target object W is mounted on the electrostatic chuck ESC such that the edge region thereof is positioned above the first portion P1 of the focus ring FR. The focus ring FR may be made of a material such as silicon, silicon carbide, silicon oxide or the like.

A coolant channel 24 is provided in the second plate 18b. A coolant is supplied from a chiller unit (not shown) provided at the outside of the chamber main body 12 into the coolant channel 24 through a line 26a. The coolant supplied into the coolant channel 24 is returned to the chiller unit through a line 26b. The coolant circulates between the coolant channel 24 and the chiller unit. By controlling a temperature of the coolant, a temperature of the target object W held on the electrostatic chuck ESC is controlled.

A plurality of (e.g., three) through-holes 25 is formed in the stage ST to penetrate therethrough. A plurality of, e.g., three, lift pins 25a is inserted into the respective through-holes 25. In FIG. 3, one through-hole 25 through which one lift pin 25a is inserted is illustrated. The lift pins 25a are supported by a link that is vertically moved by an actuator, for example. The lift pins 25a support the target object W at a leading end thereof in a state where the leading ends thereof project upward from the electrostatic chuck ESC. Then, the target object W is mounted on the electrostatic chuck ESC by lowering the lift pins 25a. The target object W that has been subjected to plasma processing is separated from the electrostatic chuck ESC by lifting the lift pins 25a. In other words, the lift pins 25a are used for loading and unloading the target object W.

The plasma processing apparatus 10 is provided with a gas supply line 28. The gas supply line 28 supplies a heat transfer gas, e.g., He gas, from a heat transfer gas supply unit (not shown) to a gap between a top surface of the electrostatic chuck ESC and a backside of the target object W.

The plasma processing apparatus 10 includes an upper electrode 30. The upper electrode 30 is provided above the stage ST and faces the stage ST. The upper electrode 30 is supported at an upper portion of the chamber main body 12 through an insulating shield member 32. The upper electrode 30 may include a top plate 34 and a holding body 36. The top plate 34 faces the chamber S and a plurality of gas injection holes 34a is formed in the top plate 34. The top plate 34 may be made of silicon or quartz. Alternatively, the top plate 34 may be formed by forming a plasma-resistant film such as an yttrium oxide film or the like on a surface of an aluminum base.

The holding body 36 detachably holds the top plate 34 and may be made of a conductive material, e.g., aluminum. The holding body 36 may have a water-cooling structure. A gas diffusion space 36a is provided in the holding body 36. A plurality of gas holes 36b communicating with the gas injection holes 34a extends downward from the gas diffusion space 36a. A gas inlet port 36c for introducing a processing gas into the gas diffusion space 36a is formed at the holding body 36. A gas supply line 38 is connected to the gas inlet port 36c.

A gas source group 40 is connected to the gas supply line 38 via a valve group 42 and a flow rate controller group 44. The gas source group 40 includes a plurality of gas sources for a plurality of gases. The valve group 42 includes a plurality of valves. The flow rate controller group 44 includes a plurality of flow rate controllers such as mass flow controllers. A plurality of gas sources of the gas source group 40 are connected to the gas supply line 38 via corresponding valves of the valve group 42 and corresponding flow rate controllers of the flow rate controller group 44, respectively.

In the plasma processing apparatus 10, a shield 46 is detachably provided along an inner wall of the chamber main body 12. The shield 46 is also provided at an outer periphery of the supporting member 14. The shield 46 prevents etching by-products from being adhered to the chamber main body 12. The shield 46 may be formed by coating ceramic such as yttrium oxide or the like on an aluminum base.

At a lower portion in the chamber main body 12, a gas exhaust plate 48 is provided between the supporting member 14 and the sidewall of the chamber main body 12. The gas exhaust plate 48 may be formed by coating ceramic such as yttrium oxide or the like on an aluminum base, for example. A plurality of holes is formed in the gas exhaust plate 48 to penetrate therethrough in a thickness direction thereof. A gas exhaust port 12e is provided at the chamber main body 12 to be positioned below the gas exhaust plate 48. A gas exhaust unit 50 is connected to the gas exhaust port 12e through a gas exhaust line 52. The gas exhaust unit 50 includes a vacuum pump such as a pressure control valve, a turbo molecular pump or the like, and thus can decrease a pressure in a space in the chamber main body 12 to a desired vacuum level. A loading/unloading port 12g for the target object W is provided at the sidewall of the chamber main body 12. The loading/unloading port 12g can be opened and closed by a gate valve 54.

The plasma processing apparatus 10 further includes a first high frequency power supply 62 and a second high frequency power supply 64. The first high frequency power supply 62 generates a first high frequency power, which has a frequency of, e.g., 27 MHz to 100 MHz, for plasma generation. The first high frequency power supply 62 is connected to the upper electrode 30 via a matching unit 66. The matching unit 66 includes a circuit for matching an output impedance of the first high frequency power supply 62 and an input impedance of the load side (the upper electrode 30 side). The first high frequency power supply 62 may be connected to the lower electrode LE via the matching unit 66.

The second high frequency power supply 64 generates a second high frequency power, which has a high frequency of, e.g., 400 kHz to 13.56 MHz, for attracting ions to the target object W. The second high frequency power supply 64 is connected to the lower electrode LE via a matching unit 68. The matching unit 68 includes a circuit for matching an output impedance of the second high frequency power supply 64 and the input impedance of a load side (the lower electrode LE side).

In the plasma processing apparatus 10, a gas from one or more gas sources selected among the gas sources is supplied into the chamber S. A pressure in the chamber S is set to a predetermined level by the gas exhaust unit 50. The gas in the chamber S is excited by the first high frequency power from the first high frequency power supply 62. Accordingly, a plasma is generated. The target object W is processed by active species. If necessary, ions may be attracted to the target object W by the second high frequency power of the second high frequency power supply 64.

Figure 4:
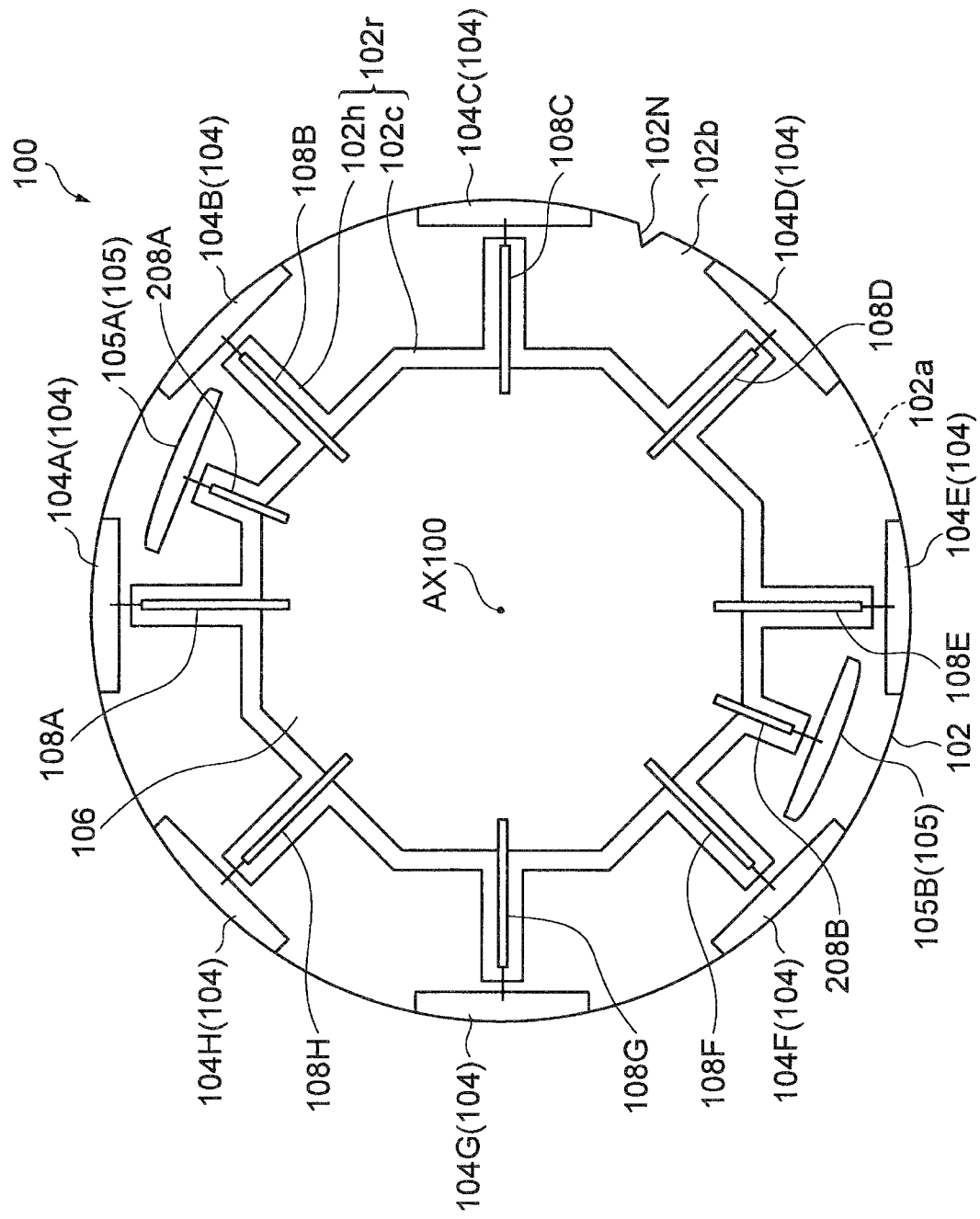
FIG. 4 is a top view showing a measuring device according to an embodiment.

Hereinafter, the measuring device will be described. FIG. 4 is a top view showing the measuring device according to the embodiment. A measuring device 100 shown in FIG. 4 includes a base substrate 102. The base substrate 102 is made of, e.g., silicon, and has the same shape as that of the target object W, i.e., a substantially disc shape. A diameter of the base substrate 102 is the same as that of the target object W, e.g., 300 mm. The shape and the size of the measuring device 100 may be determined by the shape and the size of the base substrate 102. Therefore, the measuring device 100 has the same shape and the same size as those of the target object W. A notch 102N (or another marker) is formed at an edge of the base substrate 102.

The base substrate 102 has a lower portion 102a and an upper portion 102b. The lower portion 102a is closer to the electrostatic chuck ESC compared to the upper portion 102b when the measuring device 100 is positioned on the electrostatic chuck ESC. The upper portion 102b has a top surface exposed upwardly when the measuring device 100 is positioned above the electrostatic chuck ESC.

A plurality of first sensors 104A to 104H for measuring an electrostatic capacitance is provided at the upper portion 102b of the base substrate 102. The number of the first sensors provided at the measuring device 100 may be one, or may be three or more. The first sensors 104A to 104H are provided along the edge of the base substrate 102. For example, the first sensors 104A to 104H are arranged at a regular interval around the entire edge. Specifically, front end surfaces 104f of the first sensors 104A to 104H are disposed along the edge of the upper portion 102b of the base substrate 102.

In addition, two second sensors, i.e., second sensors 105A and 105B, are fixed to the upper portion 102b of the base substrate 102 in order to correct the measurement values of the first sensors 104A to 104H. The second sensors 105A and 105B are disposed at positions separated from each other on the top surface of the upper portion 102b of the base substrate 102.

The top surface of the upper portion 102b of the base substrate 102 provides a recess 102r. The recess 102r has a central region 102c and a plurality of radial regions 102h. The central region 102c is a region intersecting with a central axis line AX 100. The central axis line AX 100 is an axis line passing through the center of the base substrate 102 in a thickness direction thereof. A circuit board 106 is provided at the central region 102c. The radial regions 102h extend in a radial direction with respect to the central axis line AX from the central region 102c to positions where the first sensors 104A to 104H and the second sensors 105A and 105B are provided. Wiring groups 108A to 108H, 208A and 208B for electrically connecting the first sensors 104A to 104H and the second sensors 105A and 105B with the circuit board 106 are provided in the radial regions 102h. Alternatively, the first sensors 104A to 104H may be provided at the lower portion 102a of the base substrate 102

Figure 5:
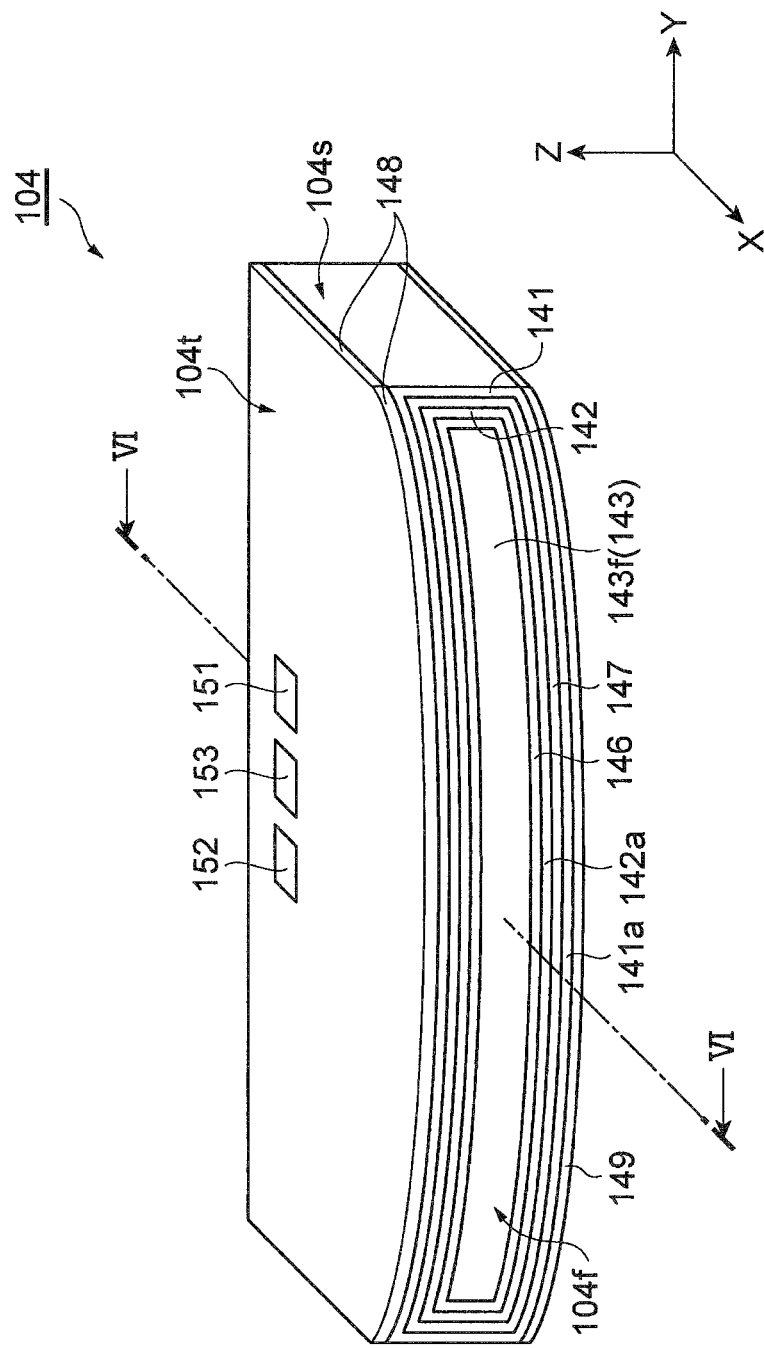
FIG. 5 is a perspective view showing an example of a first sensor.
Figure 6:
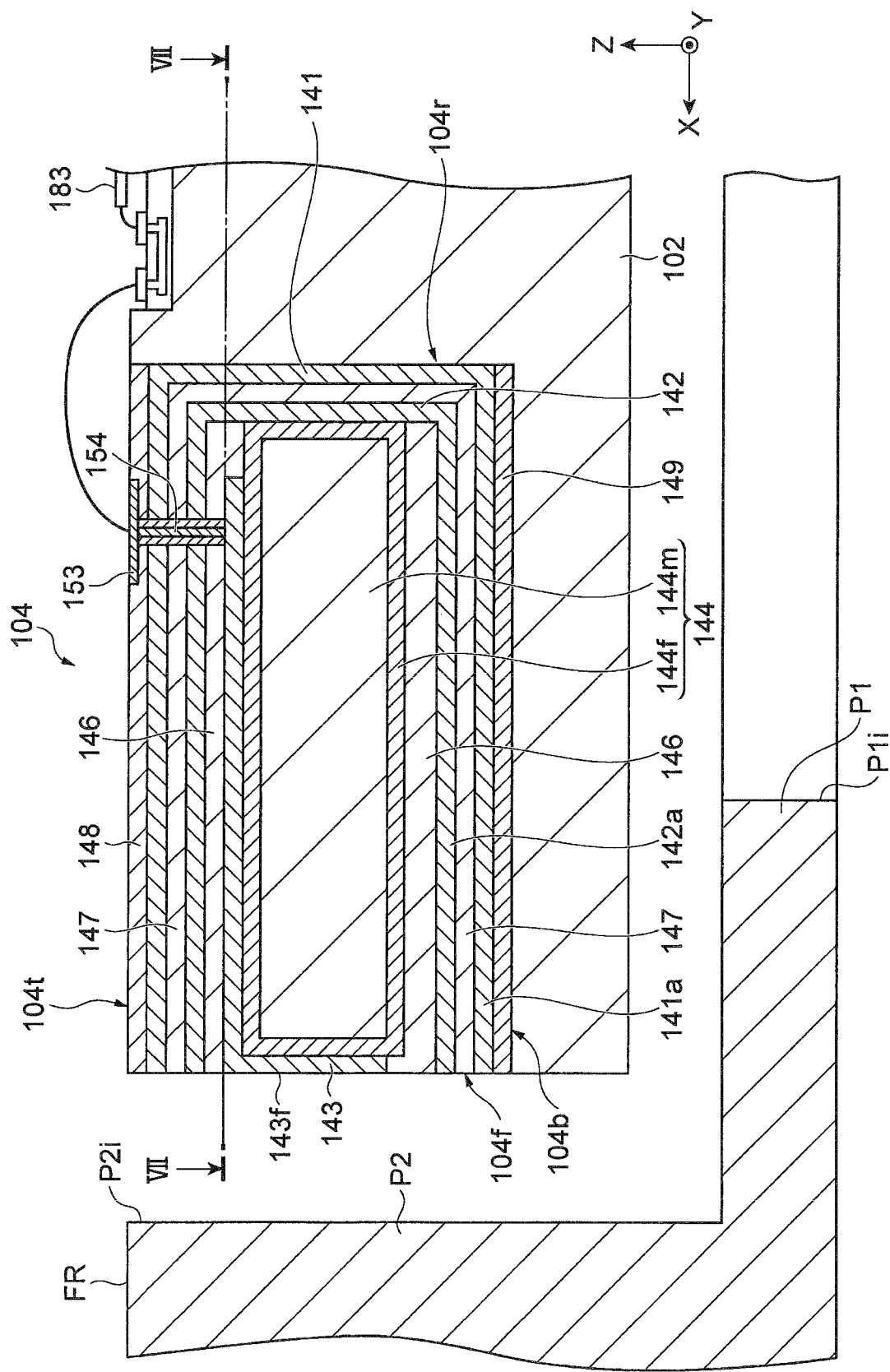
FIG. 6 is a cross sectional view taken along a line VI-VI of FIG. 5.
Figure 7:
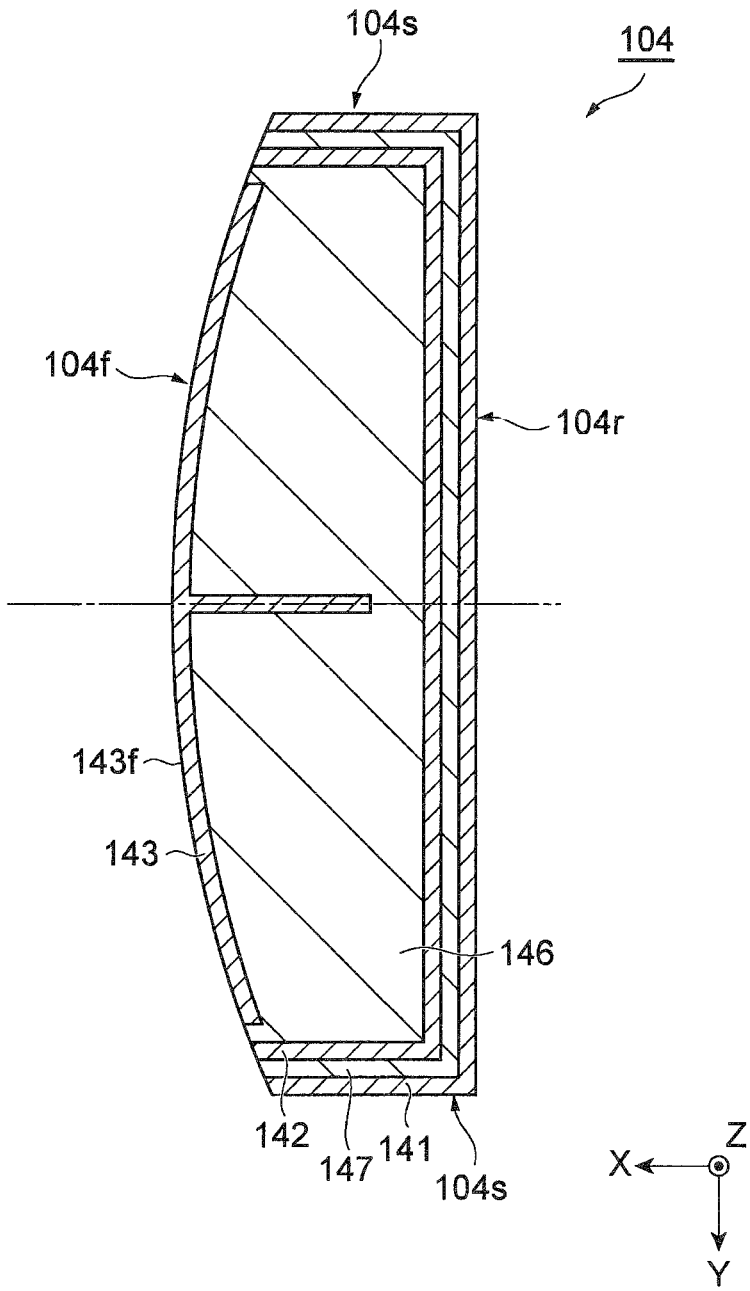
FIG. 7 is a cross sectional view taken along a line VII-VII of FIG. 6.

Hereinafter, the first sensor will be described in detail. FIG. 5 is a perspective view showing an example of the first sensor. FIG. 6 is a cross sectional view taken along a line VI-VI of FIG. 5. In FIG. 6, the base substrate of the measuring device and the focus ring are illustrated together with the first sensor. FIG. 7 is a cross sectional view taken along a line VII-VII of FIG. 6. The sensor 104 shown in FIGS. 5 to 7 is used for each of the first sensors 104A to 104H of the measuring device 100. In one example, the sensor 104 is configured as a chip-shaped component. In the following description, an XYZ orthogonal coordinate system is appropriately referred to. The X direction indicates a frontward direction of the sensor 104. The Y direction indicates a width direction of the sensor 104 that is orthogonal to the X direction. The Z direction indicates an upward direction of the sensor 104 that is orthogonal to the X direction and the Y direction.

As shown in FIGS. 5 to 7, the sensor 104 has the front end surface 104f, a top surface 104t, a bottom surface 104b, a pair of side surfaces 104s, and a rear end surface 104r. The front end surface 104f forms a front surface of the sensor 104 in the X direction. The sensor 104 is mounted on the base substrate 102 of the measuring device 100 such that the front end surface 104f is radially directed with respect to the central axis line AX 100 (see FIG. 4). In a state where the sensor 104 is mounted on the base substrate 102, the front end surface 104f extends along the edge of the base substrate 102. Therefore, when the measuring device 100 is mounted on the electrostatic chuck ESC, the front end surface 104f faces an inner periphery of the focus ring FR.

The rear end surface 104r forms a rear surface of the sensor 104 in the X direction. When the sensor 104 is mounted on the base substrate 102, the rear end surface 104r is positioned near the central axis line AX 100 compared to the front end surface 104f. The top surface 104t forms a top surface of the sensor 104 in the Z direction, and the bottom surface 104b forms a bottom surface of the sensor 104 in the Z direction. The side surfaces 104s form side surfaces of the sensor 104 in the Y direction.

The sensor 104 includes an electrode (first electrode) 143. The sensor 104 may further include electrodes 141 and 142. The electrode 141 is made of a conductor. The electrode 141 has a first portion 141a. As shown in FIGS. 5 and 6, the first portion 141a extends in the X direction and the Y direction.

The electrode 142 is made of a conductor. The electrode 142 has a second portion 142a. The second portion 142a extends above the first portion 141a. In the sensor 104, the electrode 142 is insulated from the electrode 141. As shown in FIGS. 5 and 6, the second portion 142a extends above the first portion 141a in the X direction and the Y direction.

The electrode 143 is a sensor electrode made of a conductor. The electrode 143 is provided above the first portion 141a of the electrode 141 and the second portion 142a of the electrode 142. The electrode 143 is insulated from the electrodes 141 and 142 in the sensor 104. The electrode 143 has a front surface 143f. The front surface 143f extends in a direction intersecting with the first and the second portion 141a and 142a. Further, the front surface 143f extends along the front end surface 104f of the sensor 104. In one embodiment, the front surface 143f forms a part of the front end surface 104f of the sensor 104. Or, the sensor 104 may have an insulating film covering the front surface 143f at the front side of the front surface 143f of the electrode 143.

As shown in FIGS. 5 to 7, the electrodes 141 and 142 may extend to surround the electrode 143 while opening at the side where the front surface 143f of the electrode 143 is provided (X direction). In other words, the electrodes 141 and 142 may extend to surround an upper side, a bottom side, a rear side and lateral sides of the electrode 143.

The front end surface 104f of the sensor 104 may be a curved surface having a predetermined curvature. In other words, the front end surface 104f has a constant curvature at any position thereof. The curvature of the front end surface 104f may be a reciprocal of a distance between the central axis line AX 100 of the measuring device 100 and the front end surface 104f. The sensor 104 is mounted on the base substrate 102 such that a curvature center of the front end surface 104f coincides with the central axis line AX 100.

The sensor 104 may further include a substrate member 144, insulating regions 146 to 149, pads 151 to 153, and a via wiring 154. The substrate member 144 has a main body 144m and a surface portion 144f. The main body 144m is made of, e.g., silicon. The surface portion 144f covers the surface of the main body 144m and is made of an insulating material. The surface portion 144f is, e.g., a thermal oxide film made of silicon.

The second portion 142a of the electrode 142 extends below the substrate member 144. The insulating region 146 is provided between the substrate member 144 and the electrode 142. The insulating region 146 is made of, e.g., $SiO_2$, SiN, $Al_2O_3$, or polyimide.

The first portion 141a of the electrode 141 extends below the substrate member 144 and the second portion 142a of the electrode 142. The insulating region 147 is provided between the electrodes 141 and 142 and is made of, e.g., $SiO_2$, SiN, $Al_2O_3$, or polyimide.

The insulating region 148 forms the top surface 104t of the sensor 104 and is made of, e.g., $SiO_2$, SiN, $Al_2O_3$, or polyimide. The pads 151 to 153 are formed at the insulating region 148. The pad 153 is made of a conductor and connected to the electrode 143. Specifically, the electrode 143 and the pad 153 are connected to each other through the via wiring 154 penetrating through the insulating region 146, the electrode 142, the insulating region 147 and the electrode 141. An insulator is provided around the via wiring 154. The via wiring 154 is insulated from the electrodes 141 and 142. The pad 153 is connected to the circuit board 106 through a wiring 183 provided in the radial region 102h of the recess 102r. The pads 151 and 152 are also made of a conductor. The pads 151 and 152 are connected to the electrodes 141 and 142 through corresponding via wirings, respectively. Further, the pads 151 and 152 are connected to the circuit board 106 through corresponding wirings provided in the radial regions 102h of the recess 102r, respectively.

The insulating region 149 forms the bottom surface 104b of the sensor 104. The insulating region 149 is made of, e.g., $SiO_2$, SiN, $Al_2O_3$, or polyimide.

Figure 8:
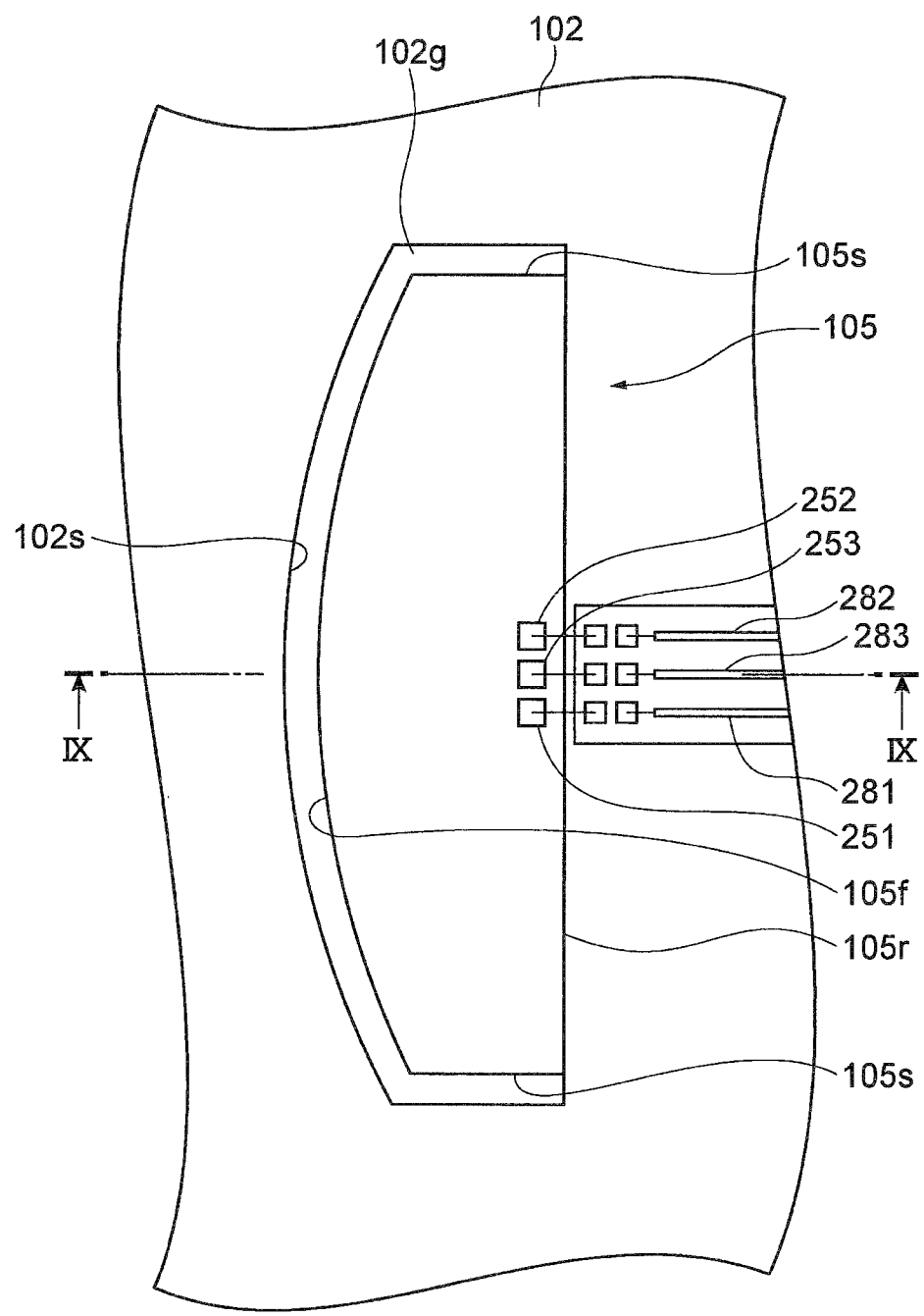
FIG. 8 is a top view showing an example of a second sensor.
Figure 9:
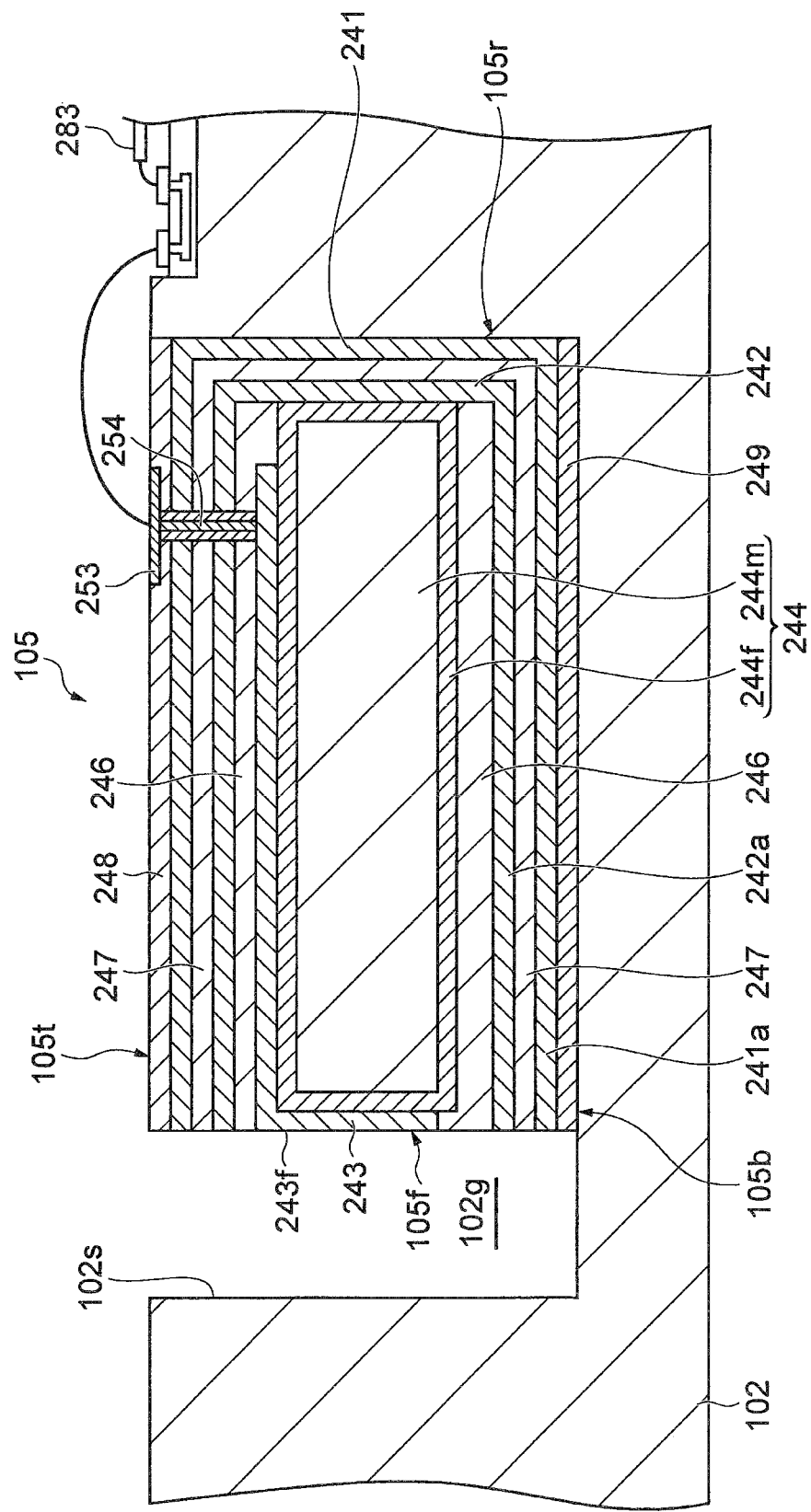
FIG. 9 is a cross sectional view taken along a line IX-IX of FIG. 8.

Hereinafter, the second sensor will be described in detail. FIG. 8 is a top view showing an example of the second sensor. FIG. 9 is a cross sectional view taken along a line IX-IX of FIG. 8. A sensor 105 shown in FIGS. 8 and 9 is an example of the second sensors 105A and 105B. The sensor 105 has the same configuration as that of the sensor 104 used as the first sensors 104A to 104H. In other words, the sensor 105 has a front end surface 105f, a top surface 105t, a bottom surface 105b, a rear end surface 105r, and a pair of side surfaces 105s corresponding to the front end surface 104f, the top surface 104t, the bottom surface 104b, the rear end surface 104r, and the pair of side surfaces 104s, respectively. The sensor 105 includes an electrode 241, a first portion 241a, an electrode 242, a second portion 242a, an electrode 243 (second electrode), a front surface 243f, a substrate member 244, a main body 244m, a surface portion 244f, insulating regions 246 to 249, pads 251 to 253, and a via wiring 254, which respectively correspond to the electrode 141, the first portion 141a, the electrode 142, the second portion 142a, the electrode 143, the front surface 143f, the substrate member 144, the main body 144m, the surface portion 144f, the insulating regions 146 to 149, the pads 151 to 153, and the via wiring 154. The pads 251 to 253 are connected to the circuit board 106 via wirings 281 to 283 provided in the radial regions 102h, respectively.

The sensor 105 is fixed in the measuring device 100. The sensor 105 is disposed in a recess 102g formed on the top surface of the upper portion 102b of the base substrate 102. The recess 102g provides a reference surface 102s facing the front end surface 105f of the sensor 105. In other words, the measuring device 100 provides two reference surfaces including a reference surface for the second sensor 105A and a reference surface for the second sensor 105B. These two reference surfaces are fixed on the measuring device 100. Therefore, a distance between the reference surface 102s and the electrode 243 (the front surface 243f) is also fixed. The reference surface 102s is a curved surface having a predetermined curvature. For example, the curvature of the reference surface 102s may be the same as that of the inner periphery of the focus ring FR. In the illustrated example, a gap is also formed between the inner surface of the recess 102g and the side surface 105s of the sensor 105.

In one embodiment, a first distance between the reference surface 102s for the second sensor 105A and the electrode 243 (the front surface 243f) of the second sensor 105A is different from a second distance between the reference surface 102s for the second sensor 105B and the electrode 243 (the front surface 243f) of the second sensor 105B. As will be described later, in the measuring device 100, a measurement value (first measurement value) indicating an electrostatic capacitance is obtained from a voltage amplitude at the electrode 143 of each of the first sensors 104A to 104H. Further, a measurement value (second measurement value) indicating an electrostatic capacitance is obtained from a voltage amplitude at each electrode 243 of the second sensor 105A and the second sensor 105B. Since the first sensors 104A to 104H and the second sensors 105A and 105B have the same configuration, a maximum measurement value that can be obtained from a voltage amplitude at each electrode of these sensors is the same. In one embodiment, the first distance is set such that a measurement value obtained from a voltage amplitude at the electrode 243 of the second sensor 105A becomes 20% or more of the maximum measurement value. The second distance is greater than the first distance. The first distance is, e.g., 0.6 mm or less, and the second distance is, e.g., 1.0 mm or more.

Figure 10:
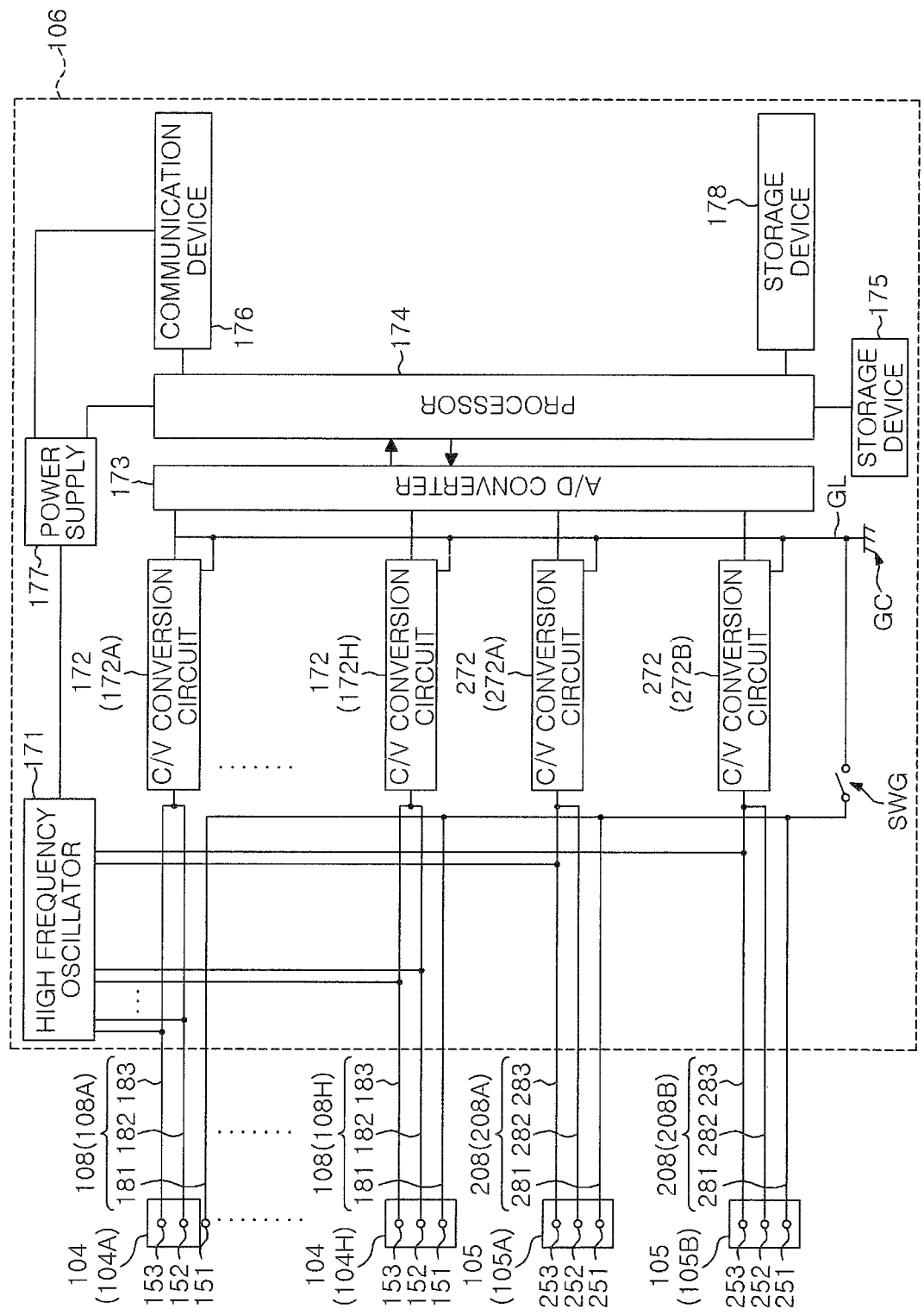
FIG. 10 shows a configuration of a circuit board of a measuring device.

Hereinafter, a configuration of the circuit board 106 will be described. FIG. 10 shows an example of the configuration of the circuit board of the measuring device. As shown in FIG. 10, the circuit board 106 includes a high frequency oscillator 171, a plurality of C/V conversion circuits 172A to 172H, 272A and 272B, an A/D converter 173, a processor (calculator) 174, a storage device (storage element) 175, a communication device 176, and a power supply 177.

Each of the first sensors 104A to 104H is connected to the circuit board 106 through a corresponding wiring group among the wiring groups 108A to 108H. Further, each of the first sensors 104A to 104H is connected to a corresponding C/V conversion circuit among the C/V conversion circuits 172A to 172H through corresponding wirings included in the corresponding wiring group. The second sensor 105A is connected to the circuit board 106 through the wiring group 208A and to the C/V conversion circuit 272A through corresponding wires included in the wiring group 208A. The second sensor 105B is connected to the circuit board 106 through the wiring group 208B and to the C/V conversion circuit 272B through corresponding wires included in the wiring group 208B.

Hereinafter, each of the first sensors 104A to 104H, each of the second sensors 105A to 105B, each of the wiring groups 108A to 108H, each of the two wiring groups 208A and 208B, each of the C/V conversion circuits 172A to 172H, and each of the two C/V conversion circuits 272A and 272B are referred to as the sensor 104, the sensor 105, a wiring group 108, a wiring group 208, a C/V conversion circuit 172, and a C/V conversion circuit 272.

The wiring group 108 includes wirings 181 to 183. One end of the wiring 181 is connected to the pad 151 connected to the electrode 141. The wiring 181 is connected to a ground potential line GL connected to a ground GC of the circuit board 106. The wiring 181 may be connected to the ground potential line GL via a switch SWG. One end of the wiring 182 is connected to the pad 152 connected to the electrode 142, and the other end of the wiring 182 is connected to the C/V conversion circuit 172. One end of the wiring 183 is connected to the pad 153 connected to the electrode 143, and the other end of the wiring 183 is connected to the C/V conversion circuit 172.

The wiring group 208 includes wirings 281 to 283. One end of the wiring 281 is connected to the pad 251 connected to the electrode 241. The wiring 281 is connected to a ground potential line GL connected to a ground GC of the circuit board 106. The wiring 281 may be connected to the ground potential line GL via a switch SWG. One end of the wiring 282 is connected to the pad 252 connected to the electrode 242, and the other end of the wiring 282 is connected to the C/V conversion circuit 272. One end of the wiring 283 is connected to the pad 253 connected to the electrode 243, and the other end of the wiring 283 is connected to the C/V conversion circuit 272.

The high frequency oscillator 171 is connected to the power supply 177 such as a battery or the like and configured to receive the power from the power supply 177 and generate a high frequency signal. The power supply 177 is also connected to the processor 174, the storage device 175 and the communication device 176. The high frequency oscillator 171 has a plurality of output lines. The high frequency oscillator 171 outputs the high frequency signals to the wirings 182, 183, 282 and 283 through the output lines. Therefore, the high frequency oscillator 171 is electrically connected to the electrodes 242 and 243 of the sensor 104, and the high frequency signals from the high frequency oscillator 171 are outputted to the electrodes 242 and 243.

The wirings 182 and 183 are connected to an input of the C/V conversion circuit 172. The wirings 282 and 283 are connected to an input of the C/V conversion circuit 272. Each of the C/V conversion circuits 172 and 272 is configured to generate a voltage signal indicating an electrostatic capacitance of the electrode connected to the input thereof based on a voltage amplitude at the input thereof and output the corresponding voltage signal. As the electrostatic capacitance of the electrode connected to the C/V conversion circuit 172 is increased, a magnitude of the voltage of the voltage signal outputted from the C/V conversion circuit 172 is increased. In the same manner, as the electrostatic capacitance of the electrode connected to the C/V conversion circuit 272 is increased, a magnitude of the voltage of the voltage signal outputted from the C/V conversion circuit 272 is increased.

Outputs of the C/V conversion circuits 172A to 172H, 272A and 272B are connected to the input of the A/D converter 173. The A/D converter 173 is also connected to the processor 174. The A/D converter 173 is controlled by the control signal from the processor 174 and converts output signals of the C/V conversion circuits 172A to 172H, 272A and 272B to digital values. In other words, the A/D converter 173 generates a first measurement value indicating an electrostatic capacitance between the electrode 143 of each of the first sensors 104A to 104H and a target object facing the corresponding electrode 143. The A/D converter 173 generates a second measurement value indicating an electrostatic capacitance between the electrode 243 of the second sensor 105A and the corresponding reference surface 102s. Further, the A/D converter 173 generates a second measurement value indicating an electrostatic capacitance between the electrode 243 of the second sensor 105B and the corresponding reference surface 102s. The A/D converter 173 outputs the first measurement value and the second measurement value to the processor 174.

The processor 174 is connected to the storage device 175. The storage device 175 is, e.g., a volatile memory or the like, and configured to store measurement data such as the first measurement value and the second measurement value. The data stored in the storage device 175 may include a correction value to be described later and/or a corrected first measurement value. The processor 174 is connected to another storage device 178. The storage device 178 is, e.g., a non-volatile memory or the like, and stores therein a program that is read and executed by the processor 174.

The communication device 176 follows any wireless communication standard. For example, the communication device 176 is based on Bluetooth (Registered Trademark). The communication device 176 is configured to wirelessly transmit the measurement data stored in the storage device 175.

The processor 174 is configured to control the respective components of the measuring device 100 by executing the aforementioned program. For example, the processor 174 is configured to control the supply of high frequency signals from the high frequency oscillator 171 to the electrodes 142, 143, 242 and 243, the supply of power from the power supply 177 to the storage device 175, the supply of power from the power supply 177 to the communication device 176, and the like. Further, the processor 174 is configured to obtain the first measurement value and the second measurement value and store the measurement values in the storage device 175 by executing the aforementioned program.

Figure 11A:
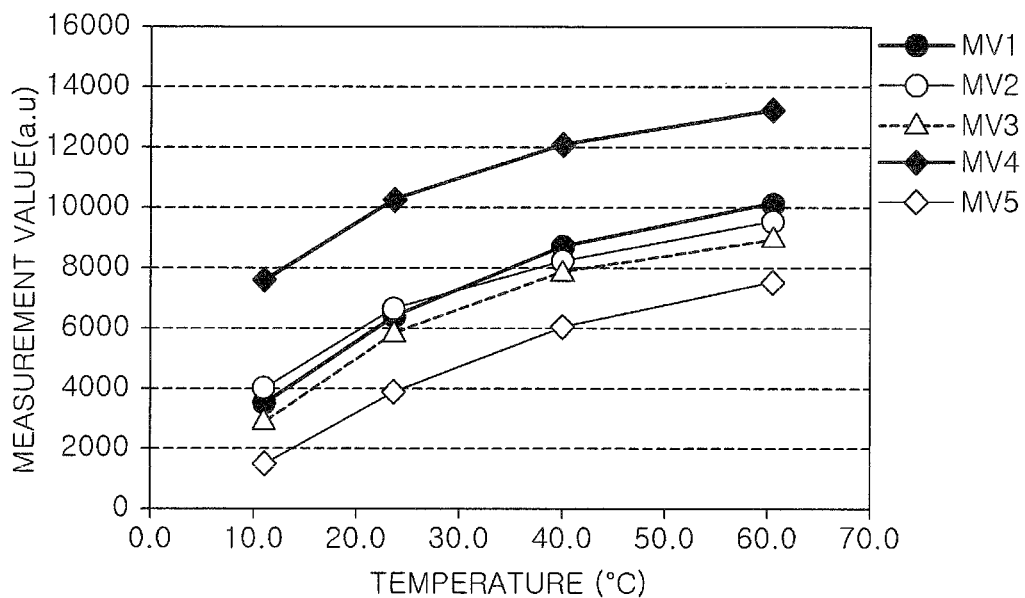
FIG. 11A is a graph showing a relation between measurement values obtained from voltage amplitudes at electrodes of a first sensor and two second sensors and a temperature of a surrounding environment of the measuring device.

In one embodiment, the processor 174 of the circuit board 106 can correct a plurality of first measurement values, i.e., first measurement values obtained from the voltage amplitudes at the respective electrodes 143 of the first sensors 104A to 104H. FIG. 11A is a graph showing the relation between measurement values (measurement values MV1 to MV3) obtained from the voltage amplitudes at the electrodes 143 of three first sensors among the plurality of first sensors 104A to 104H, a measurement value (measurement value MV4) obtained from the voltage amplitude at the electrode 243 of the second sensor 105A, a measurement value (measurement value MV5) obtained from the voltage amplitude at the electrode 243 of the second sensor 105B, and a temperature of a surrounding environment of the measuring device 100. In the graph of FIG. 11A, there are shown the measurement values obtained by setting the temperature of the surrounding environment to 10° C., 23° C., 40° C. and 60° C. in a state where a humidity of the surrounding environment of the measuring device 100 is set to 40% RH.

Figure 11B:
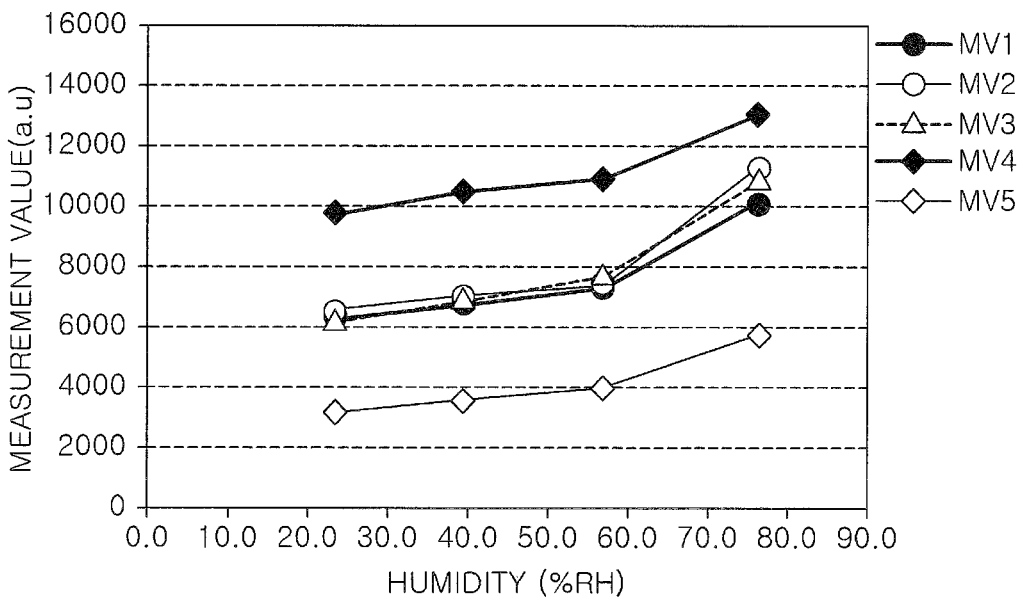
FIG. 11B is a graph showing a relation between the measurement values obtained from the voltage amplitudes at the electrodes of the first sensor and the two second sensors and a humidity of the surrounding environment of the measuring device.

FIG. 11B is a graph showing the relation between the measurement values (the measurement values MV1 to MV3) obtained from the voltage amplitudes at the electrodes 143 of three first sensors among the plurality of first sensors 104A to 104H, the measurement value (the measurement value MV4) obtained from the voltage amplitude at the electrode 243 of the second sensor 105A, the measurement value (the measurement value MV5) obtained from the voltage amplitude at the electrode 243 of the second sensor 105B, and a humidity of the surrounding environment of the measuring device 100. In the graph of FIG. 11B, there are shown the measurement values obtained by setting the humidity of the surrounding environment to 23% RH, 39% RH, 57% RH and 76% RH in a state where a temperature of the surrounding environment is set to 23° C.

In obtaining the measurement values shown in FIGS. 11A and 11B, the measuring device 100 was provided in a region surrounded by the focus ring FR, and the relative positional relation between the measuring device 100 and the focus ring FR was not changed. A distance between the electrode 243 of the second sensor 105A and the corresponding reference surface 102s was 0.5 mm and a distance between the electrode 243 of the second sensor 105B and the corresponding reference surface 102s was 1.0 mm.

As shown in FIG. 11A, the measurement values (the measurement values MV1 to MV5) obtained from the voltage amplitudes at the electrodes of the three first sensors, the second sensor 105A, and the second sensor 105B are increased as the temperature of the surrounding environment of the measuring device 100 is increased. Further, as shown in FIG. 11B, the measurement values (the measurement values MV1 to MV5) obtained from the voltage amplitudes at the electrodes of the three first sensors and the second sensors 105A and 105B are increased as the humidity of the surrounding environment of the measuring device 100 is increased. As clearly seen from FIGS. 11A and 11B, the variation in the measurement values MV1 to MV5 depending on changes in the surrounding environment of the measuring device 100 is substantially the same. Therefore, the first measurement values of the first sensors 104A to 104H can be corrected by using at least one of the two second measurement values, i.e., the second measurement value obtained from the voltage amplitude at the electrode 243 of the second sensor 105A, and the second measurement value obtained from the voltage amplitude at the electrode 243 of the second sensor 105B.

In one embodiment, the storage device 175 stores a first reference value that is the second measurement value obtained from the voltage amplitude at the electrode 243 of the second sensor 105A under a predetermined environment (standard environment). Further, the storage device 175 stores a second reference value that is the second measurement value obtained from the voltage amplitude at the electrode 243 of the second sensor 105B under the standard environment. For example, the temperature and humidity in the standard environment are 23° C. and 40% RH.

The processor 174 calculates a correction value from at least one of a first difference (MVa-RVa) between a second measurement value MVa obtained from the voltage amplitude at the electrode 243 of the second sensor 105A and a first reference value RVa and a second difference (MVb-RVb) between a second measurement value MVb obtained from the voltage amplitude at the electrode 243 of the second sensor 105B and a second reference value RVb.

In one embodiment, the processor 174 calculates the average value of the first difference (MVa-RVa) and the second difference (MVb-RVb) as the correction value. In another embodiment, the processor 174 selects the first difference (MVa-RVa) as the correction value when the first measurement value is 20% or more of the maximum measurement value and selects the second difference (MVb-RVb) as the correction value when the first measurement value is less than 20% of the maximum measurement value.

In one embodiment, the processor 174 corrects the plurality of first measurement values by using the correction value. For example, the processor 174 obtains a plurality of corrected first measurement values by subtracting the correction value from each of the plurality of first measurement values (adding an absolute value of the correction value to the first measurement values when the correction value is a negative value). The plurality of corrected first measurement values is stored in the storage device 175 and transmitted to the control unit MC by the communication device 176. The control unit MC corrects the transfer position of the target object W by the transfer mechanism TU2 by using the plurality of corrected first measurement values.

In another embodiment, the plurality of corrected first measurement values may be obtained by the control unit MC. In this embodiment, the processor 174 may transmit the plurality of first measurement values and the correction value to the control unit MC by using the communication device 176. The processor 174 may transmit two second measurement values, instead of the correction value, to the control unit MC by using the communication device 176. When the two second measurement values are transmitted from the processor 174 to the control unit MC, the control unit MC may use the previously stored first and second reference values, or the processor 174 may transmit the first and second reference values to the control unit MC by using the communication device 176.

Hereinafter, examples of the first distance and the second distance will be described in detail. As described above, the first sensors 104A to 104H, the second sensor 105A, and the second sensor 105B have the same configuration. Therefore, the maximum measurement value that can be obtained from the voltage amplitude at the electrode 143 of each of the first sensors 104A to 104H, the maximum measurement value that can be obtained from the voltage amplitude at the electrode 243 of the second sensor 105A, and the maximum measured value that can be obtained from the voltage amplitude of the electrode 243 of the second sensor 105B are the same or substantially the same.

Figure 12:
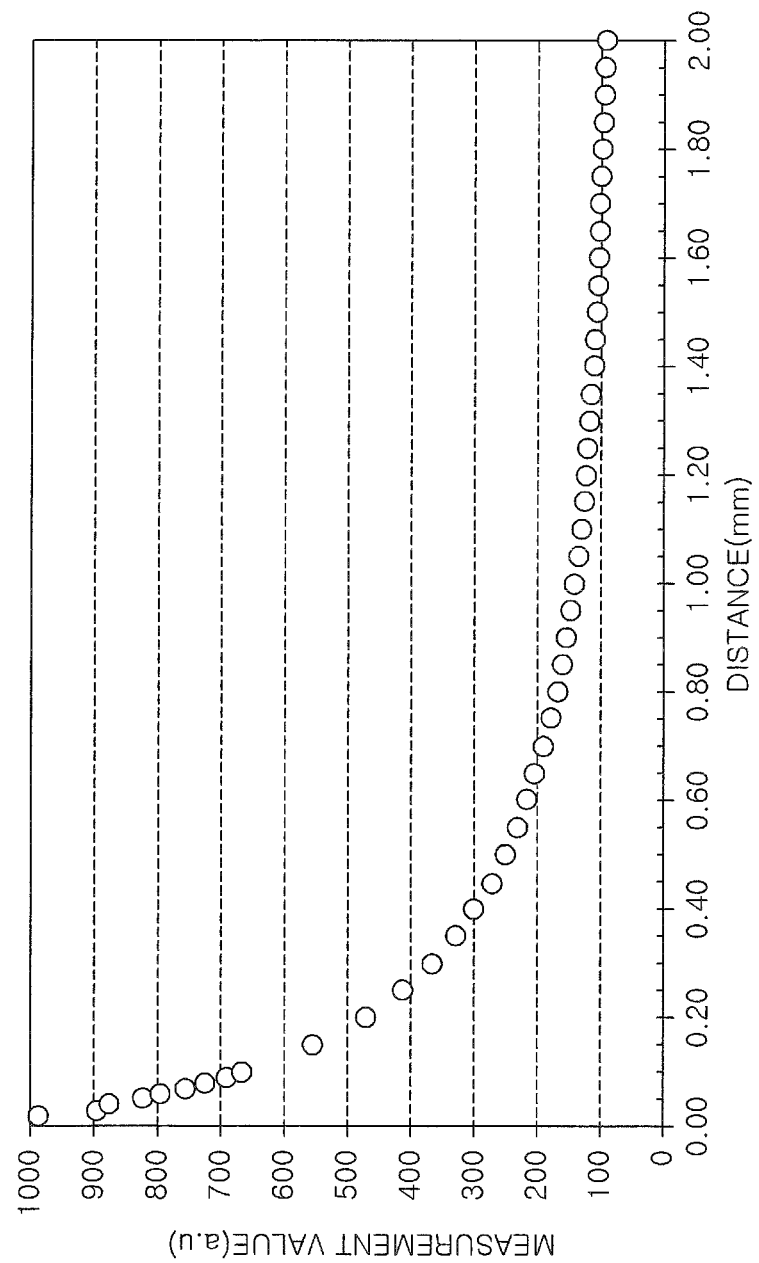
FIG. 12 is a graph showing a distance dependency of a first measurement value.

FIG. 12 is a graph showing a distance dependency of the first measurement value. In other words, the graph of FIG. 12 shows the relation between a distance between the electrode 143 of the sensor 104 and the target object facing the electrode 143 and the first measurement value. The measurement value measured by the sensor 104 indicates the electrostatic capacitance between the electrode 143 of the sensor 104 and the target object facing the electrode 143. The electrostatic capacitance C is expressed by $C=\varepsilon S/d$. $\varepsilon$ represents a dielectric constant of a medium between the electrode 143 and the target object; S represents an area of the electrode; and d represents a distance between the electrode 143 and the target object. Therefore, the magnitude of the first measurement value is in inverse proportion to the distance between the electrode 143 of the sensor 104 and the target object. As shown in FIG. 12, the first measured value varies considerably depending on the distance between the electrode 143 and the target object within a range of 20% or more of the maximum measurement value (1000 a.u.), whereas it varies less dramatically within a range less than 20% of the maximum measurement value. In one embodiment, in consideration of the distance dependency of the first measurement value, the first distance is set such that a second measurement value acquired becomes 20% or more of the maximum measurement value and the second distance is set to be greater than the first distance. For example, the first distance is 0.6 mm or less, and the second distance is 1.0 mm or more. By setting distances between the two second sensors and the corresponding reference surfaces based on the first distance and the second distance, it is possible to obtain a correction value capable of more accurately correcting the first measurement value.

The first measurement values obtained from the voltage amplitudes at the electrodes 143 of the first sensors 104A to 104H of the measuring device 100 may vary depending on changes in the surrounding environment of the measuring device 100, such as temperature, humidity or the like. This is because a circuit constant, for example, in the measuring device 100 may change depending on changes in the surrounding environment of the measuring device 100. The measuring device 100 includes the second sensors 105A and 105B in order to correct the variation in the first measurement values depending on the environment. The two electrodes 243 of the second sensors 105A and 105B face the two reference surfaces 102s, respectively. Since the second sensors 105A and 105B and the two reference surfaces 102s are fixed in the measuring device 100, the distance between each of the two electrodes 243 and the corresponding reference surface 102s is constant. Therefore, the two second measurement values obtained from the voltage amplitudes at the two electrodes 243 are not changed unless there are changes in the surrounding environment. In other words, the variation of the two second measurement values reflects the changes in the surrounding environment. The first measurement value can be corrected based on the variation of these two second measurements.

In one embodiment, the correction value used for correcting the first measurement value is obtained by the processor 174 of the circuit board 106. In one embodiment, a first correction value capable of more accurately correcting the first measurement value can be obtained by calculating an average value of the first difference and the second difference.

In another embodiment, as described above, the second distance is set such that the second measurement value obtained becomes 20% or more of the maximum measurement value, and the second distance is set to be greater than the first distance. When the first measurement value is 20% or more of the maximum measured value, the first difference is selected as the correction value. When the first measurement value is less than 20% of than the maximum measured value, the second difference is selected as the correction value. In this embodiment, either the first difference or the second difference is selected depending on the range to which the first measurement value belongs. Therefore, a highly reliable correction value is obtained depending on the first measurement value. Accordingly, in this embodiment, a correction value capable of more accurately correcting the first measurement value is obtained.

While various embodiments have been described, various modifications can be made without being limited to the above-described embodiments.

Figure 13:
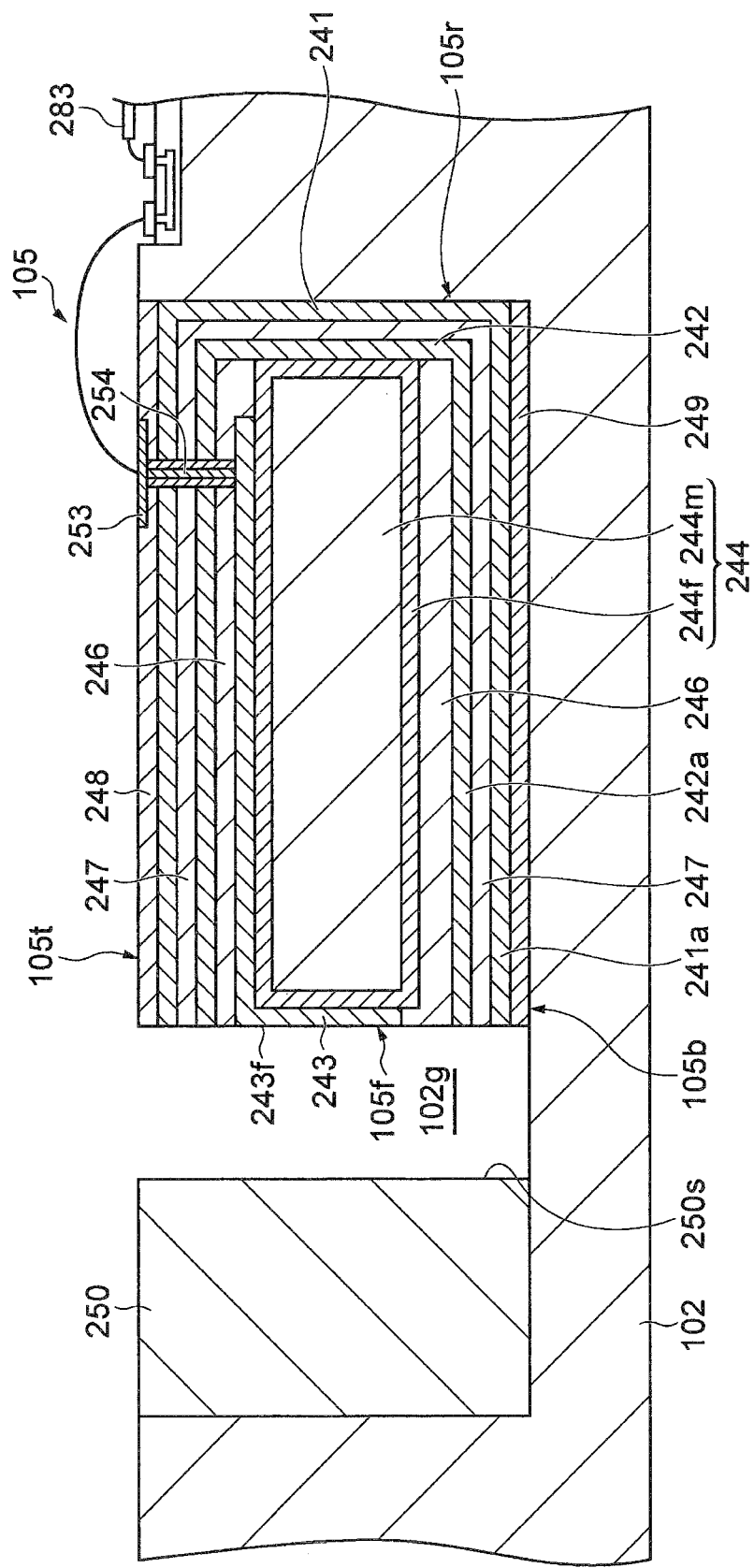
FIG. 13 shows another example of the second sensor.

For example, in the above embodiment, the reference surface 102s is the inner surface of the recess 102g formed on the base substrate 102. However, the reference surface 102s may be provided by components other than the base substrate 102. FIG. 13 shows another example of the second sensor. In the example of FIG. 13, a reference wall 250 is fixed inside the recess 102g formed in the base substrate 102. The reference wall 250 provides a reference surface 250s facing the electrode 243. In this example, a distance between the electrode 243 and the reference surface 250s can be controlled by adjusting a wall thickness of the reference wall 250.

The measuring device may include only one of the second sensors 105A and 105B. For example, the measuring device may include only the second sensor 105A in order to obtain the correction value. In this case, the storage device 175 of the circuit board 106 stores therein the reference value that is the second measurement value obtained from the voltage amplitude at the electrode 243 of the second sensor 105A under the predetermined environment. The processor 174 can obtain the correction value from the second measurement value obtained by the second sensor 105A and the reference value and correct the first measurement value by using the correction value. While the present disclosure has been shown and described with respect to the embodiments, it will be understood by those skilled in the art that various changes and modifications may be made without departing from the scope of the present disclosure as defined in the following claims.

What is claimed is:

1. An electrostatic capacitance measuring device, comprising:
    a base substrate;
    a first sensor that has a first electrode and is provided along an edge of the base substrate;
    one or more second sensors fixed on the base substrate, each having a second electrode; and
    a circuit board mounted on the base substrate, connected to the first sensor and said one or more second sensors, and configured to output high frequency signals to the first electrode and the one or more second electrodes and obtain a first measurement value indicating an electrostatic capacitance from a voltage amplitude at the first electrode and one or more second measurement values indicating electrostatic capacitances obtained from voltage amplitudes at the one or more second electrodes,
    wherein the measuring device has one or more reference surfaces that are fixed in the base substrate of the measuring device and respectively face the one or more second electrodes, and
    wherein a distance between any one of the second electrodes and a corresponding reference surface that faces said any one of the second electrodes is constant and the circuit board obtains an electrostatic capacitance between said any one of the second electrodes and the corresponding reference surface as the one or more second measurement values.

2. The measuring device of claim 1, wherein two second sensors, each of which has one second electrode, are provided as said one or more second sensors,
    two reference surfaces, which respectively face the two second electrodes, are provided as said one or more reference surfaces, and
    a first distance between one of the two second electrodes and one of the two reference surfaces that faces said one of the two second electrodes is different from a second distance between the other second electrode and the other reference surface facing the other second electrode.

3. The measuring device of claim 2, wherein the circuit board includes:
    a storage device configured to store a first reference value that is the second measurement value obtained from a voltage amplitude at said one of the second electrodes under a predetermined environment and a second reference value that is the second measurement value obtained from a voltage amplitude at the other second electrode under the predetermined environment; and
    a calculator configured to calculate a correction value from at least one of a first difference between the first reference value and the second measurement value obtained from the voltage amplitude at said one of the second electrodes and a second difference between the second reference value and the second measurement value obtained from the voltage amplitude at the other second electrode.

4. The measuring device of claim 3, wherein the calculator is configured to calculate an average value of the first difference and the second difference.

5. The measuring device of claim 3, wherein a maximum measurement value obtained from the voltage amplitude at the first electrode, a maximum measurement value obtained from the voltage amplitude at said one of the second electrodes, and a maximum measurement value obtained from the voltage amplitude at the other second electrode are the same, the first distance is set such that the second measurement value obtained from the voltage amplitude at said one of the second electrodes becomes 20% or more of the maximum measurement value, the second distance is greater than the first distance, and the calculator is configured to select the first difference as the correction value when the first measurement value is 20% or more of the maximum measurement value and select the second difference as the correction value when the first measurement value is less than 20% of the maximum measurement value.

6. The measuring device of claim 5, wherein the first distance is 0.6 mm or less.

7. The measuring device of claim 5, wherein the second distance is 1.0 mm or more.

8. The measuring device of claim 3, wherein the calculator is configured to correct the first measurement value by using the correction value.

9. The measuring device of claim 1, wherein one second sensor is provided as said one or more second sensors, one reference surface is provided as said one or more reference surfaces, and the circuit board includes:

a storage device configured to store a reference value that is the second measurement value obtained from a voltage amplitude at the second electrode of the second sensor under a predetermined environment; and a calculator configured to obtain a correction value from the second measurement value obtained from the voltage amplitude at the second electrode of the second sensor and the reference value.

10. The measuring device of claim 9, wherein the calculator is configured to correct the first measurement value by using the correction value.

11. The measuring device of claim 1, further comprising:

one or more reference walls fixed inside one or more recesses formed in the base substrate, wherein the one or more reference walls provide the one or more reference surfaces respectively facing the one or more second electrodes.

12. The measuring device of claim 1, wherein the base substrate comprises one or more recesses in each of which one of the second sensors is disposed and fixed, and wherein each of the recesses provides one of the reference surfaces and a gap is formed between said one of the reference surfaces and a second sensor facing said one of the reference surfaces.

13. The measuring device of claim 1, wherein the circuit board obtains an electrostatic capacitance between the first electrode and a target object facing the first electrode as the first measurement value.

14. The measuring device of claim 1, wherein an empty gap is formed between said any one of the second electrodes and the corresponding reference surface.

* * * * *